United States Patent
Yair et al.

(10) Patent No.: US 6,746,502 B2
(45) Date of Patent: Jun. 8, 2004

(54) ELECTRONICS ASSEMBLY WITH AIR FILTER

(75) Inventors: Andrew John Yair, Swindon (GB); John David Schnabel, Fareham (GB); Sean Conor Wrycraft, Harrow (GB); Stephen Paul Haworth, Wokingham (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/166,530

(22) Filed: Jun. 10, 2002

(65) Prior Publication Data

US 2003/0226338 A1 Dec. 11, 2003

(51) Int. Cl.⁷ .......................... B01D 29/05; G08B 21/00
(52) U.S. Cl. .......................... 55/385.6; 55/471; 55/473; 454/184; 361/685; 312/213; 312/223.1; 312/223.3; 312/223.6
(58) Field of Search ............... 55/385.6, 471, 55/473; 454/184; 361/685; 312/213, 223.1, 223.3, 223.6

(56) References Cited

U.S. PATENT DOCUMENTS

| 5,673,029 | A | * | 9/1997 | Behl et al. ................... 454/184 |
| 5,766,285 | A | * | 6/1998 | Killman ....................... 55/385.6 |
| 5,831,822 | A | * | 11/1998 | Hulick et al. ................ 361/687 |
| 5,935,282 | A | * | 8/1999 | Lin .............................. 55/385.6 |
| 6,284,010 | B1 |   | 9/2001 | Rehmert |
| 6,309,437 | B1 | * | 10/2001 | Jones ........................... 55/385.1 |
| 6,421,238 | B1 | * | 7/2002 | Negishi ........................ 454/184 |
| 6,462,947 | B1 | * | 10/2002 | Huang ......................... 361/695 |
| 6,544,311 | B1 | * | 4/2003 | Walton et al. .............. 55/385.6 |
| 6,589,308 | B1 | * | 7/2003 | Gianelo ....................... 55/385.6 |

* cited by examiner

Primary Examiner—Minh-Chau T. Pham
(74) Attorney, Agent, or Firm—Meyertons Hood Kivlin Kowert & Goetzel, P.C.

(57) ABSTRACT

An electronics assembly includes a chassis and a panel mounted on the chassis. The panel has an air filter on a surface of the panel which is retained in position on the panel by one or more retaining elements (80), for example plastics rivets, that can be operated to allow release of the air filter from the panel. The air filter can be changed very quickly during maintenance of the assembly without the need to switch the assembly off during changing of the air filter.

17 Claims, 5 Drawing Sheets

ELECTRONICS ASSEMBLY WITH AIR FILTER

BACKGROUND OF THE INVENTION

The present invention relates to electronics assemblies, and is primarily concerned with racked assemblies. Many such assemblies will be located in racks for housing in for example nineteen inch cabinets, or other size cabinets such as twenty three inch or metric cabinets. The assemblies may for instance be employed as servers for a number of systems, for example in local area networks (LANs), wide area networks (WANs), telecommunications systems or other operations such as database management or as internet servers.

Such an assembly will typically comprise a supporting chassis that houses a motherboard or backplane and a number of daughterboards or module cards that extend in planes generally perpendicular to the plane of the motherboard. Because of the amount of heat that is generated during operation of the equipment and the thermal sensitivity of the equipment, it is necessary to provide cooling fans in order to direct a current of air through the assembly or otherwise permanent damage would occur.

Typically air blown through the assembly needs to be filtered to remove dust and other contaminants. Replacement of air filters generally leads to downtime of the system, the length of which should be minimized.

SUMMARY OF THE INVENTION

According to one aspect of the invention, an air filter in the form of a cartridge comprises a frame and filter material supported by the frame. The cartridge is retained in position on a surface of the panel by one or more retaining elements that can be operated to release the cartridge from the panel. This configuration allows quick replacement of the air filter while the assembly is in operation.

According to another aspect, of the present invention there is provided an electronics assembly which comprises:
  (i) a chassis; and
  (ii) a panel that is mounted on the chassis;
  wherein the panel has, on a surface thereof, a generally planar air filter in the form of a cartridge having a frame and filter material supported by the frame, the cartridge being retained in position on the panel by means of one or more retaining elements that can be manually opened to allow release of the cartridge from the panel.

The invention has the advantage that it is possible to change the air filter relatively quickly by virtue of the design of the assembly, and even to replace the air filter or filters while the assembly is in operation.

Thus, according to yet another aspect, the invention provides a method of replacing an air filter in an electronics assembly comprising
  (i) a chassis; and
  (ii) a panel that is mounted on the chassis;
  wherein the method comprises releasing the or each retaining element, removing the air filter, locating a replacement air filter on the panel and engaging the or each retaining element; the operations being performed while the electronics assembly is in operation.

The panel may be located on the front surface of the chassis in view of the fact that this surface has the array of air filters, and so the panel may also be required to have aesthetic qualities. In this case, the air filter may be located on an inner surface of the panel, that is to say, the surface that positioned against the chassis. The panel will therefore need to be moved in order to allow access to the air filter, and so the panel may be mounted on the chassis by means of one or more hinges, for example so that it can be swung out from the chassis. Alternative methods of fixing the panel to the chassis may be employed in which the panel can be lifted or slid off the chassis.

According to another aspect, the invention provides a chassis for an electronics assembly which has a panel mounted on a surface thereof. The panel has, on a surface thereof, a generally planar air filter in the form of a cartridge having a frame and filter material supported by the frame, the cartridge being retained in position on the panel by means of one or more retaining elements that can be manually opened to allow release of the cartridge from the panel.

According to yet a further aspect, the invention provides a panel for an electronics assembly, which panel has, on a surface thereof, a generally planar air filter in the form of a cartridge having a frame and filter material supported by the frame, the cartridge being retained in position on the panel by means of one or more retaining elements that can be manually opened to allow release of the cartridge from the panel.

BRIEF DESCRIPTION OF THE DRAWINGS

Embodiments of the present invention will now be described in detail by way of example with reference to the accompanying drawings, in which corresponding parts are given like reference numbers. In the drawings.

DESCRIPTION OF PARTICULAR EMBODIMENTS

Figure 1:
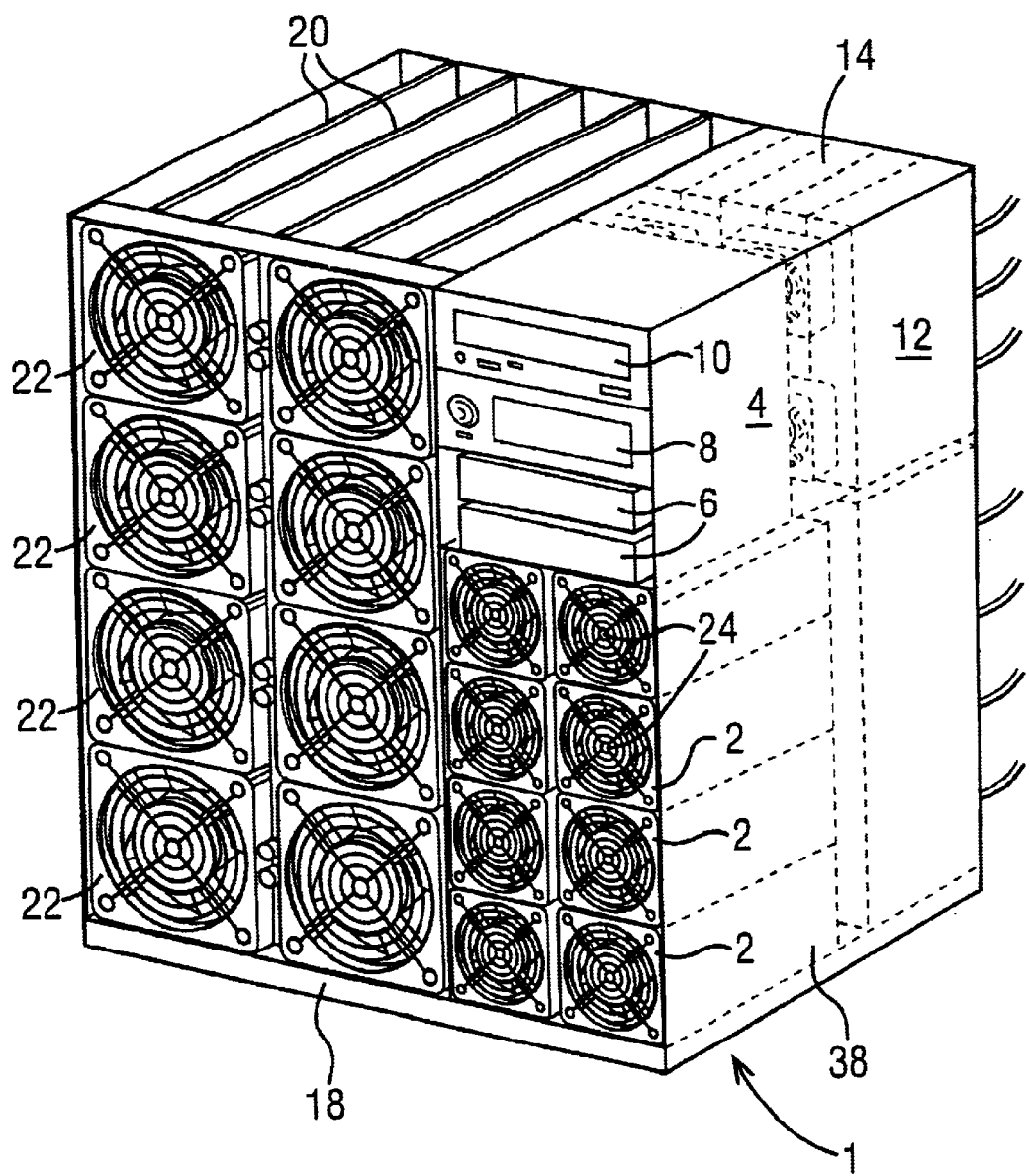
FIG. 1 is a schematic perspective view of an electronics assembly which may be employed in the present invention.

Referring now to the drawings, in which like reference numerals are used to designate corresponding elements, FIG. 1 shows an assembly according to one embodiment of the invention that forms part of a server that may be employed for a number of services, for example as part of a local area network (LAN) or for other telecommunications purposes, and is designed to fit into, for example, a nineteen inch rack electronics cabinet. Other sizes may alternatively be employed, for example to fit into twenty three inch or metric racks. The assembly may be designed to be a so-called "RAS" system, that is to say, to have high reliability, availability and serviceability. As such, it is intended that the system will operated with the minimum amount of down time, and so a degree of redundancy is incorporated so that the system will continue to operate even when certain components have failed. In addition, servicing of the equipment should take as short a time as possible, and, where practical, components can be replaced without switching the system off.

The assembly comprises a chassis 1 in which the various components are located. The chassis contains a number of power modules 2 for converting mains a.c. power to an appropriate d.c. voltage, a media area 4 that contains hard disc drives 6, a tape drive 8 and a CD-ROM or digital video disc drive 10, and a part 12 that contains a number of I/O cards 14. A motherboard is located within the chassis in a horizontal plane at the bottom of the chassis in a tray-shaped holder 18, and a number of daughterboards 20 are arranged next to each other in a vertical plane above the motherboard and to the side of the power modules 2. The daughterboards may serve any of a number of purposes, for example having CPUs or may be repeater boards etc.

Eight fans 22 are provided in an array at the front of the chassis in order to blow air through the assembly from the front, between the daughterboards 20 for cooling the motherboard and the daughterboards. Additional fans are provided such as fans 24 in the power modules 2, and further fans located between the media area 4 and the I/O cards 14. This configuration has the advantage that space is not needed above and below the chassis for providing air ducts to follow the air vertically through the assembly as has been necessary with conventional assemblies employing a vertical motherboard.

Figure 2:
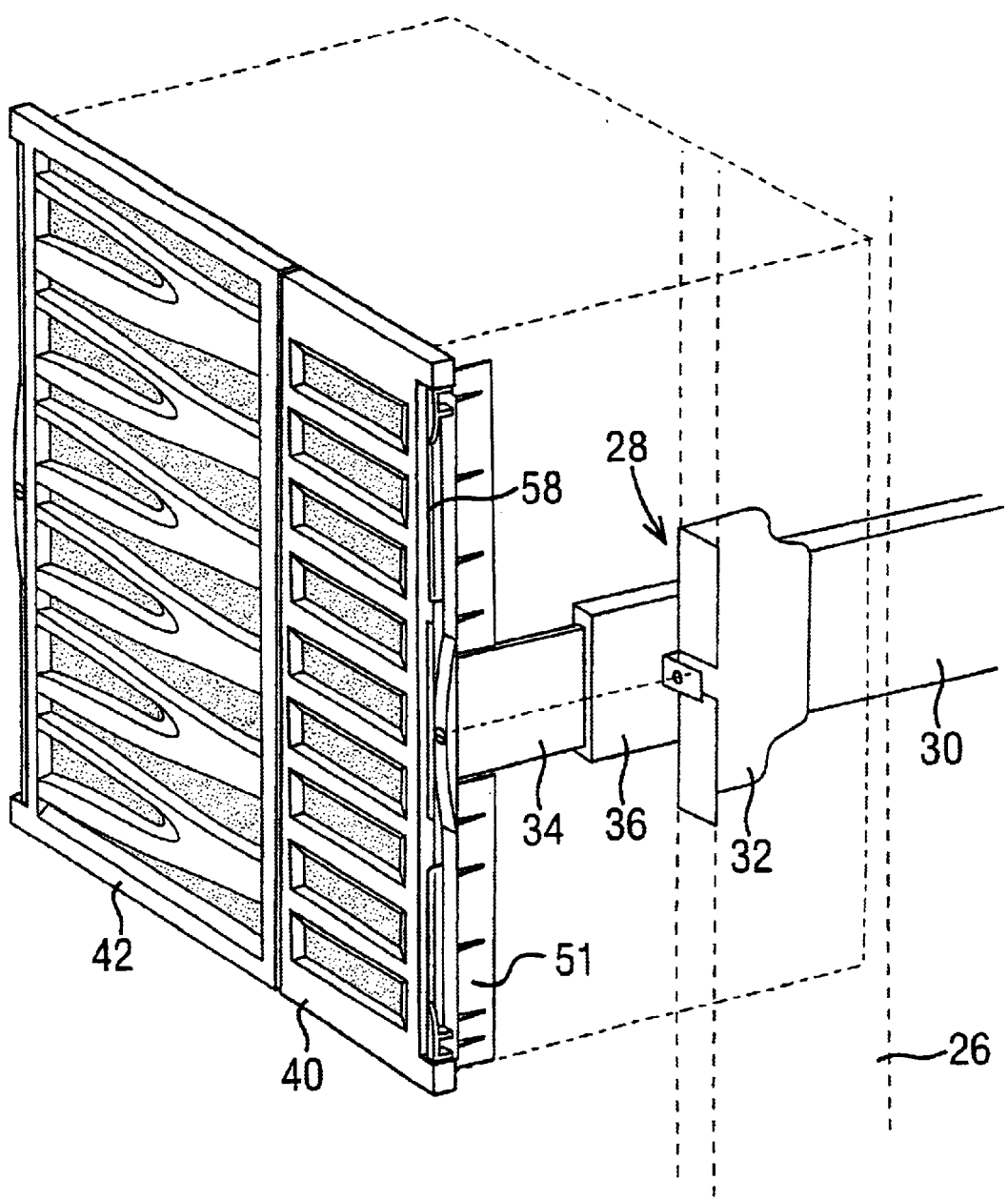
FIG. 2 is a perspective view of the assembly of FIG. 1 together with front panels thereon.

In use, the assembly is housed in an enclosure in the form of a cabinet. The cabinet will be provided with a number of posts 26 which provide rigidity to the enclosure and support the assembly, as shown in FIG. 2. The assembly is supported on the posts by means of a telescopic slider mechanism comprising a pair of telescopic sliders 28, one such slider being located on either side of the assembly. The telescopic slider comprises a fixed part 30 that is attached to the posts by means of brackets 32, the spacing of the brackets 32 being adjustable in order to accommodate different sizes of cabinet. In addition to the fixed part 30, each slider has two movable parts, one movable part 34 being attached to a side wall 38 of the chassis, and the other, an intermediate part 36, being supported by the fixed part 30 and itself supporting the movable part 34. This slider mechanism enables the assembly to be pulled forward until it is entirely outside the enclosure, and the various parts of the assembly can be accessed for maintenance purposes.

To ensure that there is no contamination of the air that is blown through the assembly, or reduced contamination thereof air may be filtered by using the air filters located inside two front panels 40 and 42 that are attached to, for example, the front surface of the chassis or the surface where fans are located. In this embodiment, two panels are employed, although only a single panel need be used if desired. Alternatively, more panels may be used. Also, as shown, the panels cover the entire front surface of the assembly. However, the panel(s) may be of a size that covers substantially the area of the assembly that is provided with air fans.

Figure 3:
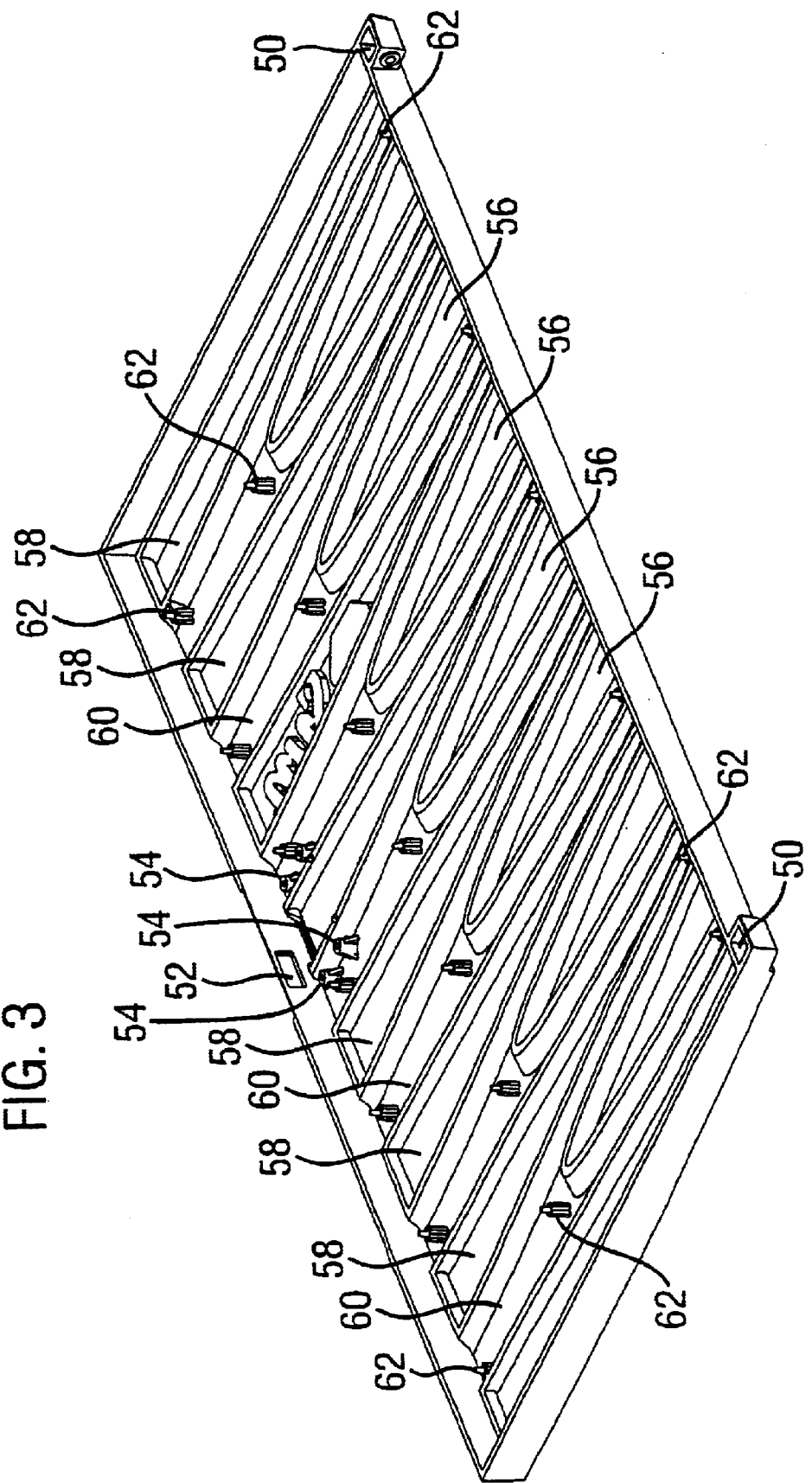
FIG. 3 is a perspective view of the rear of a plastics moulding of one of the panels.

FIG. 3 is a rear view of a blank that is employed for the front panel 42 of the assembly. The blank may be in the form of a plastics moulding although other forms may be employed if they are sufficiently lightweight. The moulding is generally flat and rectangular having recesses 50 at the top and bottom of one side for receiving hinge pins located on a corner moulding 51 attached to the chassis in order to allow the panel to swing open in the manner of a door. Other arrangements for fixing the panels may be employed instead, for example protuberances on the panel that extend into keyhole plates on the chassis or vice versa, and it is not essential that the panel be able to open as a door. At the other side a recess 52 is provided and mounting posts 54 in order to install a lock or latch. The panel has an array of apertures 56 extending along one side, and a further array of apertures 58 extending along the other side of the panel so that the apertures in total occupy a majority of the area of the panel. Areas 60 of solid plastics are arranged between the apertures 56 and 58 and a number of positioning posts 62 are provided in these regions for heat staking a perforated steel sheet.

Figure 4:
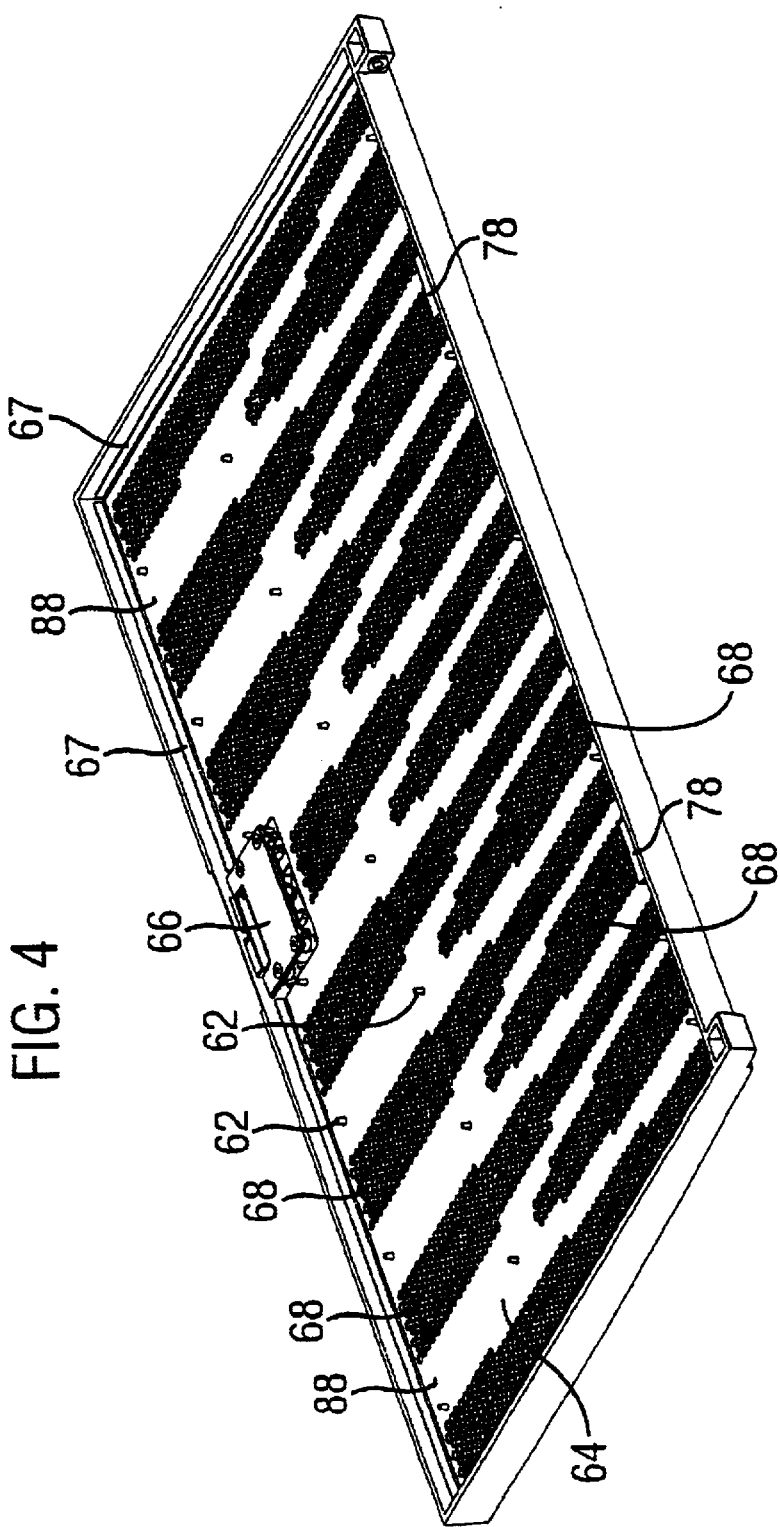
FIG. 4 is a perspective view of the rear of the plastics moulding of FIG. 3 together with a perforated metal sheet.

FIG. 4 is a rear view of the plastics moulding shown in FIG. 3 with a perforated steel sheet 64 and lock 66 in place. The sheet 64 has an array of perforated regions 68 that corresponds to the array of large apertures 56 and 58 in the plastics moulding. The sheet also has flanges 67 extending along each edge thereof, and a number of holes for receiving the positioning posts 62. The perforated sheet 64 is retained in place by means of a heat staking process in which the sheet and panel moulding are passed by a source of heat which melts the positioning posts 62 that protrude through the perforated sheet. Perforated sheet 64 provides strength to the panel, as well as providing a screen behind the large apertures 56 and 58 in the panel. Perforated sheet 64 also allows air to pass through the panel to the fans 22.

Figure 5:
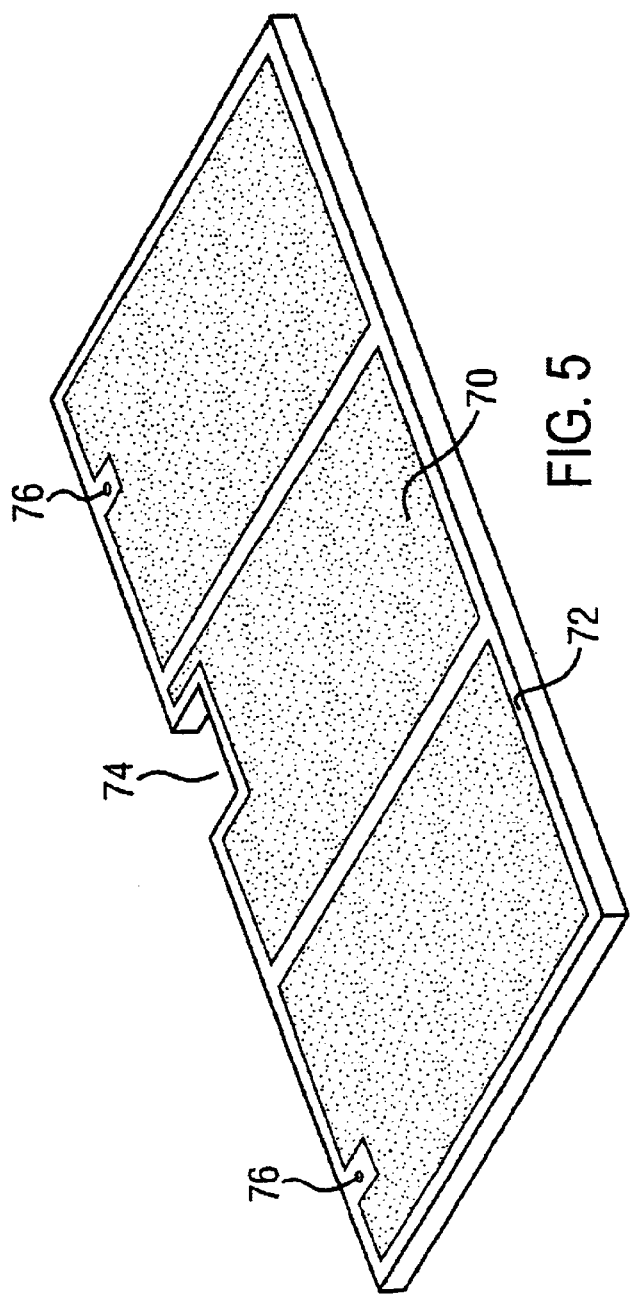
FIG. 5 is a perspective view of an air filter employed in the invention.
Figure 6:
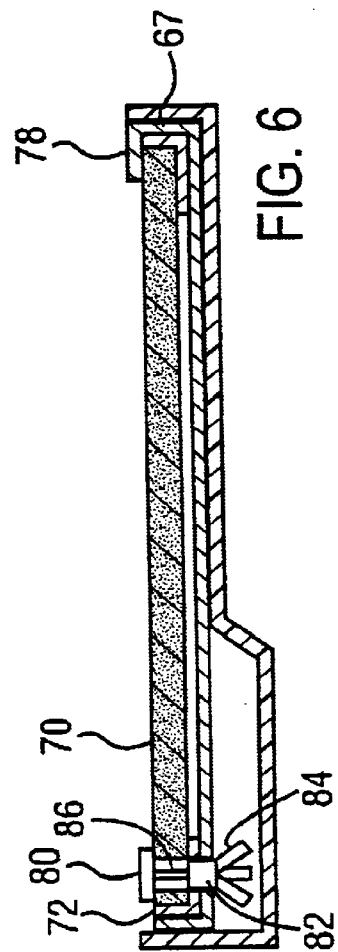
FIG. 6 is a section through the panel of FIG. 4 incorporating the air filter.

FIG. 5 is a perspective view of an air filter employed in one embodiment of the present invention. The filter comprises a layer of filter material 70, for example an open-cell foam, that is held in an frame 72. The frame may be formed from aluminium in order to reduce its weight although other materials, for example plastics or thin steel may be used. Other materials may be employed for the filter, for example a fibre mat. The frame 72 has a cut-out 74 to accommodate the lock 66 in the panel, and also has a pair of holes 76 for receiving fasteners 80.

When the air filter is positioned in the panel, it occupies the entire area of the perforated sheet 64, and is correctly positioned on the sheet by means of the flanges 67 extending around the edge of the sheet. One of the flanges 67 on the perforated sheet on the side of the sheet opposite the lock 66 is provided with a pair of tabs 78 which prevent the side of the frame adjacent to the tabs from coming out of the perforated sheet but allows the opposite side of the filter to swing out. Alternatively, a lip may be provided on the end of flange 67 to retain the air filter.

The opposite side of the air filter is retained on the perforated sheet by means of fasteners 80 in the form of a plastics rivet or split pin fastener. This has a ring 82 with a pair of legs 84 depending therefrom. The fastener includes a plunger 86 having a tapered end that causes the legs 84 to splay outwardly when the plunger is either pushed toward the ring or pulled away from the ring, depending on direction of taper. This form of fastener is quick and simple to operate, and may be operated many times. When the air filter is positioned in the perforated sheet, the holes 76 in the filter are in register with holes 88 in the perforated sheet, so that a fastener on the air filter can be pushed through the holes 88 and operated to retain the air filter on the perforated sheet.

Other forms of fastener may be employed instead of the split-pin type. The fasteners will normally be quick-release fasteners, that is to say, one which can be operated to fasten and release by a simple manual manipulation. These fasteners may also be tool-less, that is to say, no keys or the like are required for operation. Such fasteners include those that operate using a keyhole aperture in the perforated sheet so that the air filter can be released simply by sliding the filter so that an appropriate element moves across the aperture to a position where it will be released. Other forms of retaining element may be used, for example a latch which may be located on the perforated sheet and which may be rotated into and out of engagement with an edge of the air filter.

In order to change the air filter, the panel is unlatched and swung open to reveal the air filter on its rear surface. The air filter can be removed by releasing the fastener, swinging out the filter about the tabs 78 on the flange 67 of the perforated sheet and removing it, replacing the filter with a new one and fastening it to the perforated sheet. The panel can then be closed and the equipment operates as before. This operation can take no more than a few seconds, and, in view of its speed, may be performed while the equipment is still operating.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

We claim:

1. An electronics assembly which comprises:
   (i) a chassis; and
   (ii) a panel that is mounted on the chassis by one or more hinges such that the panel can be swung out from the chassis;
   wherein the panel has an outer surface that is directed away from the chassis, and an inner surface that is positioned against the chassis, and the panel has an air filter on the inner surface thereof, wherein one end of the air filter is held on the panel so that it can he swung out from the panel to be released when the panel has been swung out from the chassis, and wherein the air filter is retained in position on the panel by one or more retaining elements that prevent the air filter being swung out from the panel, but that can be operated to allow release of the air filter from the panel.

2. An assembly as claimed in claim 1, wherein the air filter is in the form of a cartridge having a frame and filter material supported by the frame.

3. An assembly as claimed in claim 2, wherein the cartridge is retained in position on the panel by means of the one or more retaining elements that can be manually opened to allow release of the cartridge from the panel.

4. An assembly as claimed in claim 1, wherein each of the one or more retaining elements is a quick-release fastener.

5. An assembly as claimed in claim 1, wherein each of the one or more retaining elements is a tool-less fastener.

6. An assembly as claimed in claim 3, wherein each of the one or more retaining elements comprises a split pin having legs that splay out to retain the filter and that can be forced together to enable the filter to be removed.

7. An assembly as claimed in claim 1, wherein each of the one or more retaining elements comprises a latch that can be closed or released by twisting.

8. An assembly as claimed in claim 1, wherein one of the panel and the filter includes a lip that holds the filter and allows it to be swung out from the panel.

9. An assembly as claimed in claim 1, wherein the panel includes a perforated sheet that allows passage of air therethrough and which supports the air filter.

10. An assembly as claimed in claim 9, wherein the panel includes a plastics facia that is heat-staked to the perforated sheet.

11. An assembly as claimed in claim 9, wherein the or each retaining element retains the air filter against the perforated sheet.

12. An assembly as claimed in claim 11, wherein the panel includes a facia, at least part of which is separated from the perforated sheet in a direction normal to the sheet, to accommodate any parts of the or each retaining element that extend through the perforated sheet.

13. An assembly as claimed in claim 1, which includes one or more air fans located in a region thereof adjacent to the panel.

14. An assembly as claimed in claim 1, which includes a plurality of panels.

15. A chassis for an electronics assembly which has a panel mounted on a surface thereof by one or more hinges so that the panel can be swung out from the chassis, wherein the panel has an outer surface that is directed away from the chassis and an inner surface that is positioned against the chassis, and has, on the inner surface thereof, a generally planar air filter in the form of a cartridge having a frame and filter material supported by the frame, wherein one end of the cartridge is held on the panel so that it can he swung out from the panel, and wherein the cartridge is retained in position on the panel by means of one or more retaining elements that prevent the cartridge from being swung out from the panel, but that can be manually opened to allow release of the cartridge from the panel.

16. A panel for an electronics assembly, which panel has one or more hinges to enable it to be mounted on the assembly and be swung out from the assembly, and, has, on a surface thereof, a generally planar air filter in the form of a cartridge having a frame and filter material supported by the frame, wherein one end of the cartridge is held on the panel so that it can be swung out from the panel to be released when the panel has been swung out from the chassis, and wherein the cartridge is retained in position on the panel by means of one or more retaining elements that prevent the cartridge being swung out from the panel, but that can be manually opened to allow release of the cartridge from the panel.

17. A method of replacing an air filter in an electronics assembly comprising
   (i) a chassis; and
   (ii) a panel that is mounted on the chassis by one or more hinges so that an outer surface is directed away from the chassis and an inner surface is positioned against the chassis, the panel having a generally planar air filter that is retained in position against the inner surface of the panel by means of one or more retaining elements;
   wherein the method comprises swinging the panel out from the chassis to allow access to the inner surface thereof, releasing the one or more retaining elements, removing the air filter, locating a replacement air filter on the panel and engaging the one or more retaining elements; the operations being performed while the electronics assembly is in operation.

\* \* \* \* \*

UNITED STATES PATENT AND TRADEMARK OFFICE
CERTIFICATE OF CORRECTION

PATENT NO.   : 6,746,502 B2
DATED        : June 8, 2004
INVENTOR(S)  : Yair et al.

It is certified that error appears in the above-identified patent and that said Letters Patent is hereby corrected as shown below:

Column 5,
Line 36, please replace "can he swung" with -- can be swung --.

Signed and Sealed this

Thirtieth Day of November, 2004

JON W. DUDAS
*Director of the United States Patent and Trademark Office*